United States Patent
Yano et al.

(10) Patent No.: US 12,532,691 B2
(45) Date of Patent: Jan. 20, 2026

(54) DRY ICE CLEANING APPARATUS FOR SEMICONDUCTOR WAFERS AND METHOD FOR CLEANING SEMICONDUCTOR WAFERS

(71) Applicant: TAIYO NIPPON SANSO CORPORATION, Tokyo (JP)

(72) Inventors: Yoshiki Yano, Tokyo (JP); Keita Fuchigami, Tokyo (JP)

(73) Assignee: TAIYO NIPPON SANSO CORPORATION, Tokyo (JP)

( * ) Notice: Subject to any disclaimer, the term of this patent is extended or adjusted under 35 U.S.C. 154(b) by 0 days.

(21) Appl. No.: 18/710,466

(22) PCT Filed: Nov. 14, 2022

(86) PCT No.: PCT/JP2022/042247
§ 371 (c)(1),
(2) Date: May 15, 2024

(87) PCT Pub. No.: WO2023/090290
PCT Pub. Date: May 25, 2023

(65) Prior Publication Data
US 2024/0332036 A1    Oct. 3, 2024

(30) Foreign Application Priority Data
Nov. 16, 2021    (JP) .................................. 2021-186477

(51) Int. Cl.
*H01L 21/67*    (2006.01)
*B24C 1/00*    (2006.01)
(Continued)

(52) U.S. Cl.
CPC ........ *H01L 21/67028* (2013.01); *B24C 1/003* (2013.01); *H01L 21/6732* (2013.01); *B24C 3/322* (2013.01)

(58) Field of Classification Search
CPC ..... H01L 21/67028; H01L 2224/80012; H01L 2224/80192; H01L 2224/81012;
(Continued)

(56) References Cited

U.S. PATENT DOCUMENTS 6,099,396 A * 8/2000 Krone-Schmidt ...... B24C 1/003
451/39
2006/0096622 A1 * 5/2006 Lee .................... H01L 21/67028
134/94.1
(Continued)

FOREIGN PATENT DOCUMENTS

CN    101276739 A    10/2008
JP    6-97143 A    4/1994
(Continued)

OTHER PUBLICATIONS

Written Opinion of the International Search Authority mailed Jan. 24, 2023 in International Application No. PCT/JP2022/042247, with English translation, 8 pages.
(Continued)

*Primary Examiner* — Benjamin L Osterhout
*Assistant Examiner* — Kevin G Lee
(74) *Attorney, Agent, or Firm* — Nixon & Vanderhye P.C.

(57) ABSTRACT

An object of the present invention is to provide a dry ice cleaning apparatus for a semiconductor wafer and a method for cleaning a semiconductor wafer that can reduce the amount of particles remaining on the surface of a semiconductor wafer, suppress a decrease of cleaning effects due to ice formation, and continuously and effectively clean a large amount of semiconductor wafers. The present invention provides a dry ice cleaning apparatus for a semiconductor wafer including a cleaning chamber (1) into which the semiconductor wafers (W) are sequentially carried in and which has an internal space (11) for cleaning the semicon-
(Continued)

ductor wafers (W), an inject cleaning nozzle (5) that is disposed in the internal space (11) of the cleaning chamber (1) and injects the dry ice (D) toward the cleaning surface of the semiconductor wafer (w), and a transfer robot (2) that is disposed in the internal space (11) of the cleaning chamber (1) and sequentially carries the semiconductor wafers (W) from the outside of the cleaning chamber (1) into the internal space (11); and wherein while the transfer robot (2) holding the semiconductor wafer (W) carried into the internal space (11) non-horizontally, the inject cleaning nozzle (5) injects the dry ice (D) onto the semiconductor wafer (W).

7 Claims, 6 Drawing Sheets

(51) Int. Cl.
  *B24C 3/32* (2006.01)
  *H01L 21/673* (2006.01)
(58) Field of Classification Search
  CPC . H01L 2224/81912; H01L 2224/83012; H01L 2224/83912; H01L 2224/84012; H01L 2224/84912; H01L 21/6732; B24C 1/003
  See application file for complete search history.

(56) References Cited

U.S. PATENT DOCUMENTS

| | | | | |
|---|---|---|---|---|
| 2008/0267747 A1* | 10/2008 | DiBella | ............ | H01L 21/68707 901/30 |
| 2016/0184967 A1* | 6/2016 | Ujiie | ........................ | B24C 5/04 451/39 |

FOREIGN PATENT DOCUMENTS

| | | | | |
|---|---|---|---|---|
| JP | 2006-140201 A | 6/2006 | | |
| JP | 2021-12998 A | 2/2021 | | |
| KR | 2006060395 A | * | 6/2006 | ............ B08B 15/02 |
| TW | 201532737 A | 9/2015 | | |
| WO | WO 2015/022732 A1 | 2/2015 | | |
| WO | WO 2021/112156 A1 | 6/2021 | | |

OTHER PUBLICATIONS

International Search Report mailed Jan. 24, 2023 in International Application No. PCT/JP2022/042247, with English translation, 5 pages.
Notice of Reasons for Refusal mailed Oct. 17, 2022 in Japanese Application No. 2021-186477, with English translation, 10 pages.
Written Opinion mailed Dec. 22, 2022 in Japanese Application No. 2021-186477, with English translation, 11 pages.
Notice of Reasons for Refusal mailed Jan. 12, 2023 in Japanese Application No. 2021-186477, with English translation, 6 pages.
Written Opinion mailed Feb. 17, 2023 in Japanese Application No. 2021-186477, with English translation, 9 pages.
Decision to Grant a Patent mailed Mar. 10, 2023 in Japanese Application No. 2021-186477, with English translation, 5 pages.
Air Water Co., Ltd., News Release, "Development of a System That Can Clean Even Complex Shapes with High Efficiency with NTN Corporation," Mar. 29, 2017, with partial English translation, 3 pages.
Notice of Allowance mailed Feb. 1, 2024 in Taiwanese Application No. 111143587, with English translation of Search Report, 5 pages.
Office Action mailed Dec. 26, 2024 in Chinese Application No. 202280067671.2, with English translation of Search Report, 8 pages.
Office Action dated Sep. 25, 2025 issued in Chinese Application No. 202280067671.2 with English translation (13 pages).

* cited by examiner

DRY ICE CLEANING APPARATUS FOR SEMICONDUCTOR WAFERS AND METHOD FOR CLEANING SEMICONDUCTOR WAFERS

CROSS-REFERENCE TO RELATED APPLICATIONS

This application is the U.S. national phase of International Application No. PCT/JP2022/042247 filed Nov. 14, 2022 which designated the U.S. and claims priority to JP Patent Application No. 2021-186477 filed Nov. 16, 2021, the entire contents of each of which are hereby incorporated by reference.

TECHNICAL FIELD

The present invention relates to a dry ice cleaning apparatus for a semiconductor wafer and a method for cleaning a semiconductor wafer.

BACKGROUND ART

Conventionally, wet cleaning has been mainly used to clean a semiconductor wafer. Wet cleaning is a method of removing submicron-sized dust (particles), metal stains, organic substances, oils and fats, natural oxide films, and the like on the wafer using a chemical solution. Such a cleaning method is also employed, for example, in an etching process for patterning a wafer.

Although the wet cleaning method has many advantages, it also has several disadvantages, such as the need for processing harmful chemicals and wastewater, and the need for a step of drying the substrate. As a method that can overcome these disadvantages, dry cleaning methods that do not use chemicals have become widely adopted. Since the dry cleaning method employs a gas cleaning process, it has the advantage of not generating waste liquid and eliminating the need for a drying process.

As a method for manufacturing a semiconductor device by cleaning the surface of a semiconductor wafer by dry cleaning, a method is disclosed for manufacturing semiconductor devices including a step in which a thin metal film is formed on a semiconductor wafer that constitutes a semiconductor substrate and the thin metal film is patterned by etching, and a step in which fences made by etching are removed after patterning (for example, Patent Document 1 below).

In addition, as a device for cleaning the surface of a semiconductor wafer by dry cleaning, a cleaning device has been proposed in which a semiconductor wafer is held by a robot, a nozzle that injects dry ice is placed close to the semiconductor wafer, and the surface of the semiconductor wafer is cleaned while moving the nozzle so as to trace the surface of the semiconductor wafer (for example, Non-Patent Document 1 below).

The method of cleaning a semiconductor wafer using dry ice, as described in Patent Document 1 and Non-Patent Document 1, has been used industrially for a long time. In recent years, such a method has been used in the semiconductor manufacturing field as one of the dry cleaning methods. Similar to the general dry cleaning method, the cleaning method using dry ice above has great advantages such as eliminating the need for waste liquid treatment and drying steps, and suppressing damage to the object to be cleaned.

PRIOR ART DOCUMENTS

Patent Documents

Patent Document 1 Japanese Unexamined Patent Application, First Publication No. 2021-012998

Non-Patent Documents

Air Water Co., Ltd., News Release, "Development of a system that can clean even complex shapes with high efficiency with NTN," Mar. 29, 2017, Internet <URL: https://www.awi.co.jp/ja/business/news/news649299410893875824/main/0/link/e49c641bddc7e569edc8bebdbeb4eae2155254a3.pdf>

SUMMARY OF INVENTION

Problem to be Solved by the Invention

On the other hand, the dry cleaning method above has a problem in that particles and minute burrs that cannot be removed and remain on the surface of the semiconductor wafer, reducing the yield of the semiconductor wafer. In particular, in the case of methods using dry ice, dry ice has a very low temperature of −79° C., so if there is moisture around it, it will form ice, and the dry ice itself will sublimate. In some cases, it is difficult to obtain the desired cleaning performance. Therefore, there is a problem in that particles attached to the surface of the semiconductor wafer cannot be completely removed, and particles remain on the surface of the semiconductor wafer after cleaning.

In the cleaning method in the semiconductor manufacturing method described in Patent Document 1, after patterning is performed on the semiconductor wafer, dry ice cleaning is performed to remove the fence made by etching. However, Patent Document 1 does not mention the residue on the surface of the semiconductor wafer, and the effect of removing particles is unclear.

In addition, in the cleaning device described in Non-Patent Document 1, since the surface of the semiconductor wafer is installed facing upward, there is a limit to the effectiveness of suppressing the remaining particles falling from above.

In recent years, with the miniaturization of semiconductor circuits, it has become particularly important to further improve the yield and element characteristics of semiconductor devices. For this reason, there has been a need to further reduce particles remaining on the surface of semiconductor wafers after cleaning, which have a significant impact on yield and device characteristics during the manufacturing of semiconductor devices.

The present invention has been made in view of the problems above, and provides a dry ice cleaning apparatus for a semiconductor wafer and a method for cleaning a semiconductor wafer that can reduce the amount of particles remaining on the surface of a semiconductor wafer and can continuously and effectively clean a large amount of semiconductor wafers.

Means for Solving the Problem

In order to solve the above problems, the present invention provides the following dry ice cleaning apparatus for a semiconductor wafer and a method for cleaning a semiconductor wafer.

The present invention provides a dry ice cleaning apparatus for a semiconductor wafer that removes impurities attached to a cleaning surface of the semiconductor wafer by injecting dry ice onto the semiconductor wafer, wherein the dry ice cleaning apparatus includes: a cleaning chamber into which the semiconductor wafers are sequentially carried in and which has an internal space for cleaning the semiconductor wafers; an inject cleaning nozzle that is disposed in the internal space of the cleaning chamber and injects the dry ice toward the cleaning surface of the semiconductor wafer; and a transfer robot that is disposed in the internal space of the cleaning chamber and sequentially carries the semiconductor wafers from the outside of the cleaning chamber into the internal space; and wherein while the transfer robot holds the semiconductor wafer carried into the internal space non-horizontally, the inject cleaning nozzle injects the dry ice onto the semiconductor wafer.

According to the dry ice cleaning apparatus for a semiconductor wafer above, the inject cleaning nozzle injects the dry ice onto the semiconductor wafer while the transfer robot holds the semiconductor wafer non-horizontally, thereby particles, burrs, and the like attached to the surface of the semiconductor wafer can be effectively removed. This makes it possible to reduce the amount of particles remaining on the surface of the semiconductor wafer, and to continuously and effectively clean a large amount of semiconductor wafers.

In the dry ice cleaning apparatus for a semiconductor wafer, it is preferable that the transfer robot include: a holding section including a back plate that holds the semiconductor wafer; and an arm portion that can support the holding section non-horizontally and movably support the holding section in the internal space of the cleaning chamber.

According to the dry ice cleaning apparatus for a semiconductor wafer above, since the apparatus includes the transfer robot having the holding section including the back plate and an arm portion, the semiconductor wafer is stably supported by the back plate even when the dry ice injected from the inject cleaning nozzle is under high pressure. This prevents the semiconductor wafer from being deformed or damaged by high-pressure dry ice.

In addition, in the dry ice cleaning apparatus for a semiconductor wafer above, it is preferable that the transfer robot hold the semiconductor wafer carried into the internal space along the vertical direction, or hold the semiconductor wafer so that the cleaning surface of the semiconductor wafer faces diagonally upward at an angle of 30° or less with respect to the vertical direction.

That is, in the dry ice cleaning apparatus for a semiconductor wafer according to the present invention, it is preferable that the transfer robot hold the semiconductor wafer carried into the internal space at an angle of 0° to 30° with respect to the vertical direction so that the semiconductor wafer is vertical or the cleaning surface of the semiconductor wafer faces diagonally upward.

According to the dry ice cleaning apparatus for a semiconductor wafer above, the transfer robot holds the semiconductor wafer at the angle above, that is, holds the semiconductor wafer vertically or the cleaning surface of the semiconductor wafer facing diagonally upward. Therefore, particles, burrs, and the like attached to the surface of the semiconductor wafer are effectively dropped by the dry ice injected from the inject cleaning nozzle. As a result, the effect of reducing the amount of particles remaining on the surface of the semiconductor wafer can be more significantly achieved.

Further, in the dry ice cleaning apparatus for a semiconductor wafer above, it is preferable that the inject cleaning nozzle inject the dry ice onto the cleaning surface from a perpendicular direction, or inject the dry ice downward at an angle of 80° or less with respect to the perpendicular direction.

In other words, in the dry ice cleaning apparatus for a semiconductor wafer according to the present invention, it is preferable that the inject cleaning nozzle inject the dry ice at an angle of 0° to 80° with respect to a direction perpendicular to the cleaning surface of the semiconductor wafer, that is, the inject cleaning nozzle inject the dry ice in a direction that is perpendicular to the cleaning surface of the semiconductor wafer or in a direction that is more downward than perpendicular to the cleaning surface of the semiconductor wafer.

According to the dry ice cleaning apparatus for a semiconductor wafer above, the inject cleaning nozzle injects the dry ice in a direction that is perpendicular to the cleaning surface of the semiconductor wafer or in a direction that is more downward than perpendicular to the cleaning surface of the semiconductor wafer. Therefore, particles, burrs, and the like attached to the surface of the semiconductor wafer are more effectively dropped by the dry ice injected from the inject cleaning nozzle. Thereby, the amount of particles remaining on the surface of the semiconductor wafer can be more effectively reduced.

The dry ice cleaning apparatus for a semiconductor wafer according to the present invention may further include a fan filter unit that circulates a purifying gas in the internal space of the cleaning chamber by causing the purifying gas to flow down from the ceiling side to the floor side of the cleaning chamber.

According to the dry ice cleaning apparatus for a semiconductor wafer above, since having the fan filter unit above, the purifying gas circulates in the cleaning chamber in a down flow, particles, burrs, and the like attached to the surface of the semiconductor wafer are removed by dry ice injected from the inject cleaning nozzle, then the particles, burrs, and the like are circulated along the flow direction of the purifying gas, and reliably collected by the fan filter unit. This allows clean purifying gas to be circulated in the cleaning chamber, thereby further enhancing the cleaning effect on the semiconductor wafer.

Further, in the dry ice cleaning apparatus for a semiconductor wafer according to the present invention, it is preferable that the purifying gas be high purity nitrogen gas or clean dry air.

According to the dry ice cleaning apparatus for a semiconductor wafer above, by using high-purity nitrogen gas or clean dry air as the purifying gas that is circulated down by the fan filter unit, when dry ice is injected into the semiconductor wafer, it is possible to suppress the formation of ice derived from the atmospheric gas on the cleaning surface due to the dry ice. Additionally, it is also possible to prevent the inject cleaning nozzle from being dew-condensed. Therefore, the cleaning effect on the semiconductor wafer is further enhanced, and a large amount of semiconductor wafers can be continuously cleaned.

Furthermore, the present invention provides a method for cleaning a semiconductor wafer that removes impurities attached to a cleaning surface of a semiconductor wafer by injecting dry ice onto the semiconductor wafer using any one of the dry ice cleaning apparatuses for a semiconductor wafer described above, wherein while a semiconductor wafer carried into the internal space of the cleaning chamber is held non-horizontally, the dry ice is injected onto the semiconductor wafer.

The method for cleaning a semiconductor wafer according to the present invention is a method in which dry ice is injected onto a semiconductor wafer using the dry ice cleaning apparatus for a semiconductor wafer above, and the surface of the semiconductor wafer is cleaned. Therefore, similar to the dry ice cleaning apparatus above, particles, burrs, and the like attached to the surface of the semiconductor wafer can be effectively removed. This makes it possible to reduce the amount of particles remaining on the surface of the semiconductor wafer, and to continuously and effectively clean a large amount of semiconductor wafers.

Effects of the Invention

According to the dry ice cleaning apparatus for a semiconductor wafer of the present invention, particles, burrs, and the like attached to the surface of the semiconductor wafer can be effectively removed. Therefore, the amount of particles remaining on the surface of the semiconductor wafer can be reduced, and a large amount of semiconductor wafers can be continuously and effectively cleaned.

The method for cleaning a semiconductor wafer according to the present invention is a method in which dry ice is injected onto a semiconductor wafer using the dry ice cleaning apparatus for a semiconductor wafer above, and the surface of the semiconductor wafer is cleaned. Therefore, similar to the dry ice cleaning apparatus above, particles, burrs, and the like attached to the surface of the semiconductor wafer can be effectively removed. This makes it possible to reduce the amount of particles remaining on the surface of the semiconductor wafer, and to continuously and effectively clean a large amount of semiconductor wafers.

DETAILED DESCRIPTION OF THE PREFERRED EMBODIMENTS

Hereinafter, a dry ice cleaning apparatus for a semiconductor wafer and a method of cleaning a semiconductor wafer of one embodiment according to the present invention will be described with reference to FIGS. 1 to 6A and 6B as appropriate. Note that the drawings used in the following explanations may show characteristic parts enlarged for convenience in order to make the characteristics easier to understand, and the dimensional ratios of each component may not be the same as in reality. Furthermore, the materials and the like exemplified in the following description are merely examples, and the present invention is not limited thereto, and can be implemented with appropriate changes within the scope of the gist thereof.

A semiconductor wafer, which is an object to be cleaned by the dry ice cleaning apparatus for a semiconductor wafer and the method for cleaning a semiconductor wafer according to the present invention, is, for example, a semiconductor substrate made of a single crystal such as silicon. Usually, various semiconductor crystals are grown on the surface of the semiconductor wafer by a method such as vapor phase growth, then a thin metal film is formed and patterned to form a circuit including fine wirings and elements, and thereby a semiconductor device is produced.

Therefore, when considering the yield when producing a semiconductor device and the element characteristics of the resulting semiconductor device, impurities, such as particles, burrs, and the like remaining on the surface of the semiconductor wafer are required to be removed as much as possible. The dry ice cleaning apparatus for a semiconductor wafer and the method for cleaning a semiconductor wafer according to the present invention can remove impurities remaining on the cleaning surface of a semiconductor wafer as much as possible.

<Dry Ice Cleaning Apparatus for a Semiconductor Wafer>

The dry ice cleaning apparatus for a semiconductor wafer of the present embodiment will be explained with reference to each drawing.

Figure 1:
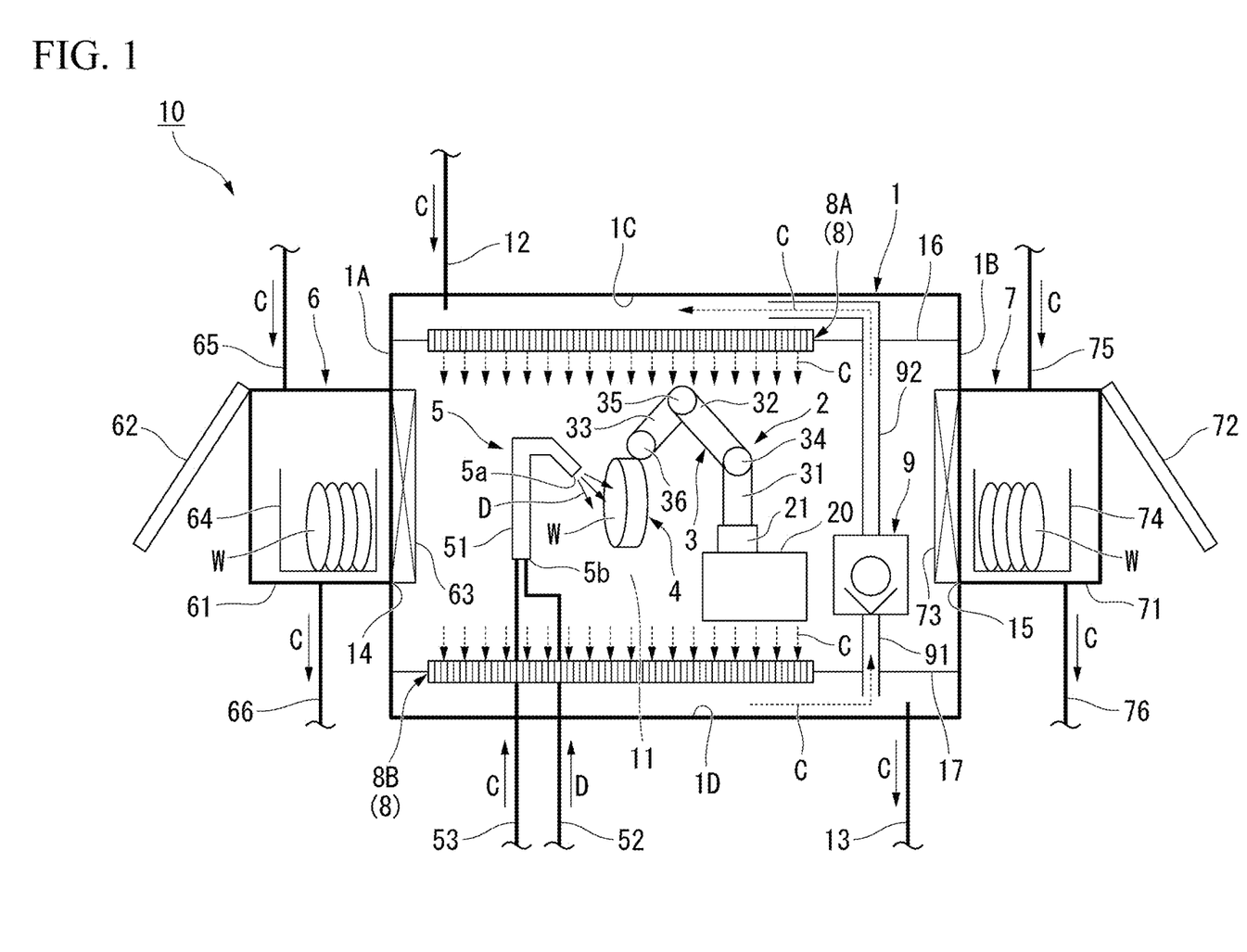
FIG. 1 is a diagram schematically illustrating a dry ice cleaning apparatus for a semiconductor wafer and a method for cleaning a semiconductor wafer according to an embodiment of the present invention, and is a schematic diagram showing the overall configuration of the dry ice cleaning apparatus for semiconductor wafers.
Figure 2:
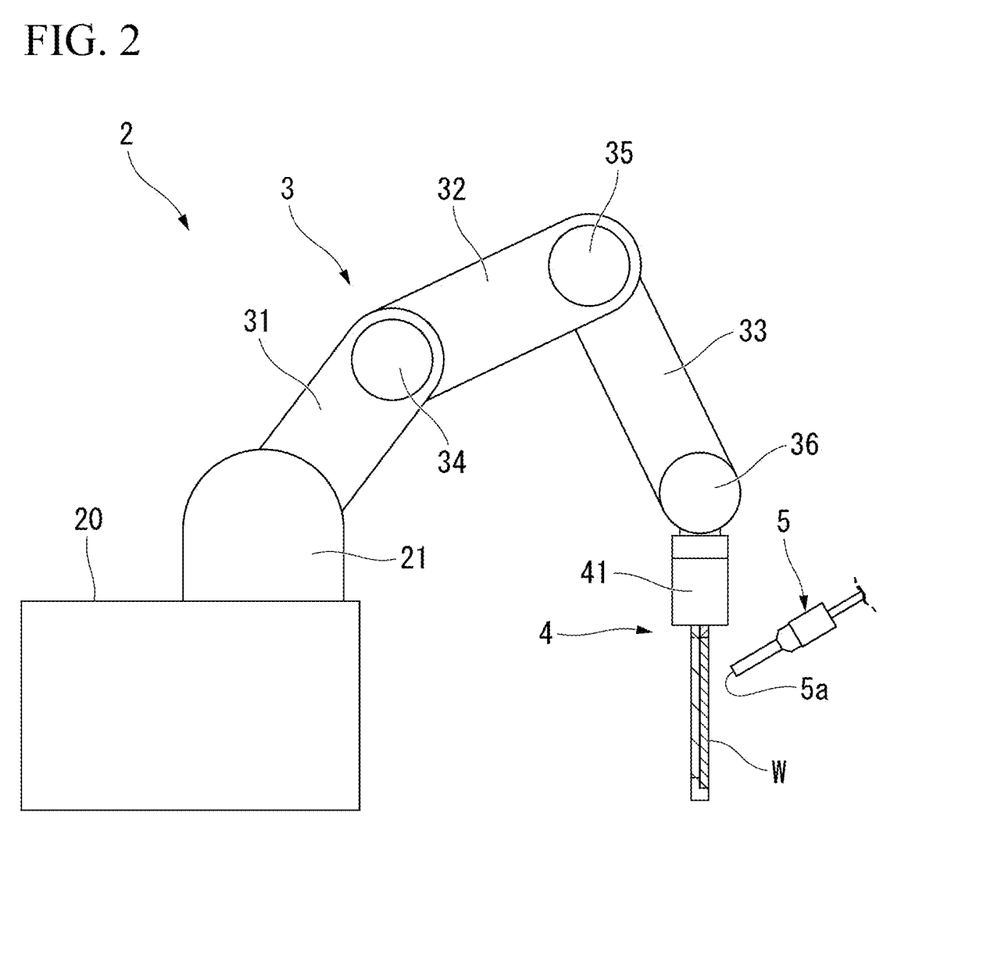
FIG. 2 is a diagram schematically illustrating a dry ice cleaning apparatus for a semiconductor wafer and a method for cleaning a semiconductor wafer according to an embodiment of the present invention, and is an enlarged side view showing a transfer robot provided in the dry ice cleaning apparatus for a semiconductor wafer shown in FIG. 1.
Figure 3:
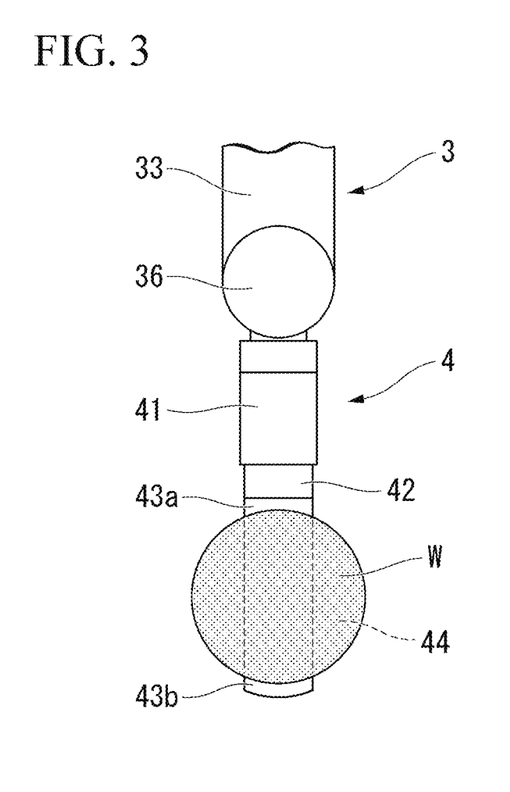
FIG. 3 is a diagram schematically illustrating a dry ice cleaning apparatus for a semiconductor wafer and a cleaning method for a semiconductor wafer according to an embodiment of the present invention, and is a front view of the transfer robot shown in FIG. 2.
Figure 4A:
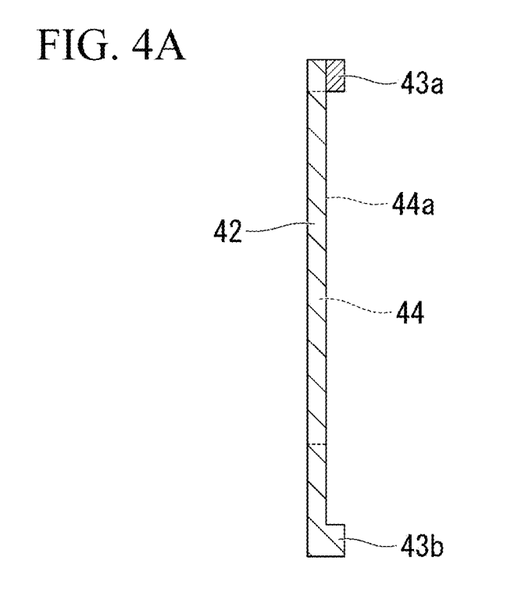
FIG. 4A is a diagram schematically illustrating a dry ice cleaning apparatus for a semiconductor wafer and a method for cleaning a semiconductor wafer according to an embodiment of the present invention, and shows a back plate of a holding section provided in the transfer robot shown in FIGS. 2 and 3.
Figure 4B:
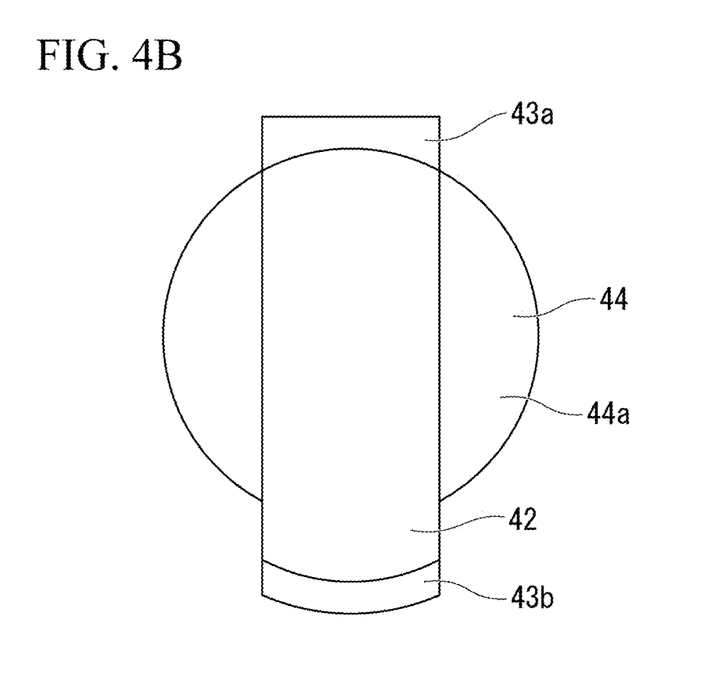
FIG. 4B is a diagram schematically illustrating a dry ice cleaning apparatus for a semiconductor wafer and a method for cleaning a semiconductor wafer according to an embodiment of the present invention, and is an enlarged planar view showing the holding section including the back plate shown in FIG. 4A.
Figure 5A:
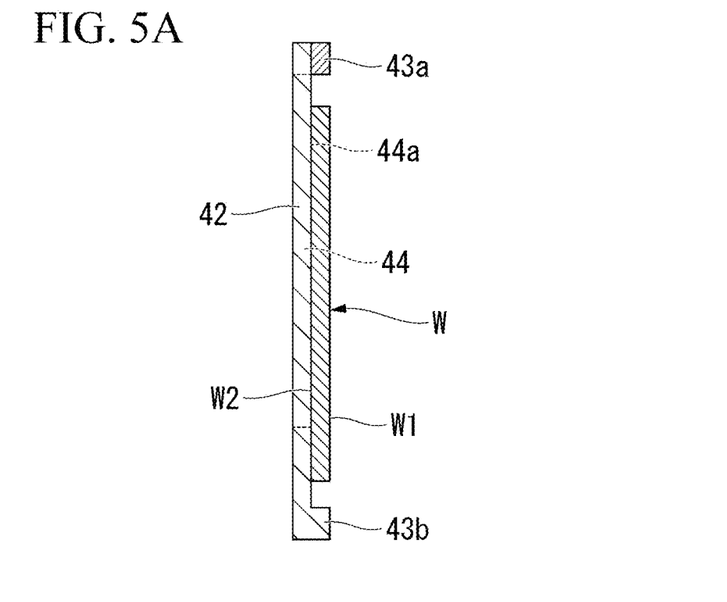
FIG. 5A is a diagram schematically illustrating a dry ice cleaning apparatus for a semiconductor wafer and a method for cleaning a semiconductor wafer according to an embodiment of the present invention, and is a cross-sectional view showing a procedure for bolding a semiconductor wafer in the holding section including the back plate shown in FIGS. 4A and 4B.
Figure 5B:
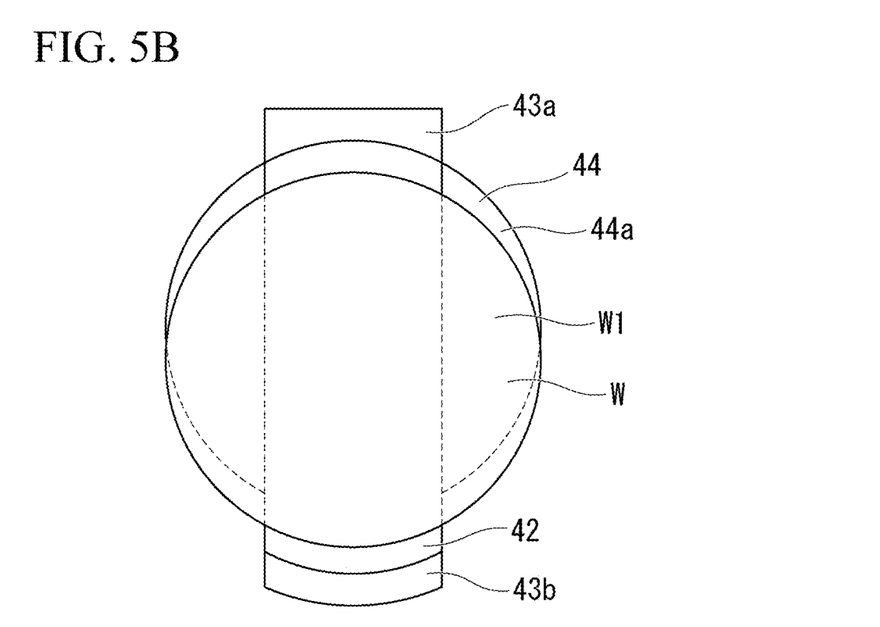
FIG. 5B is a diagram schematically illustrating a dry ice cleaning apparatus for a semiconductor wafer and a method for cleaning a semiconductor wafer according to an embodiment of the present invention, and is a planar view showing a procedure for holding a semiconductor wafer in the holding section including the back plate shown in FIGS. 4A and 4B.
Figure 6A:
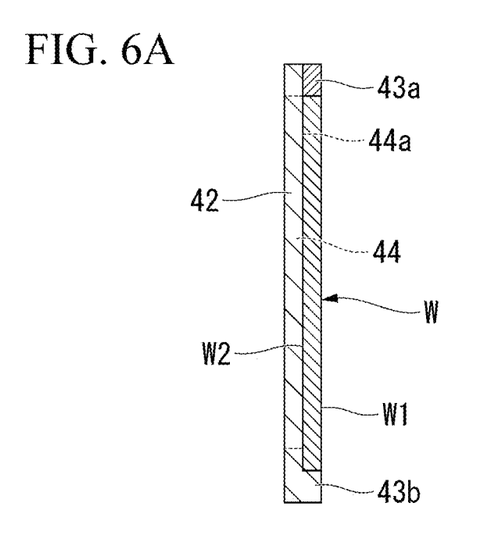
FIG. 6A is a diagram schematically illustrating a dry ice cleaning apparatus for a semiconductor wafer and a method for cleaning a semiconductor wafer according to an embodiment of the present invention, and is a cross-sectional view showing a state in which the semiconductor wafer is held in the holding section shown in FIGS. 4A and 4B.
Figure 6B:
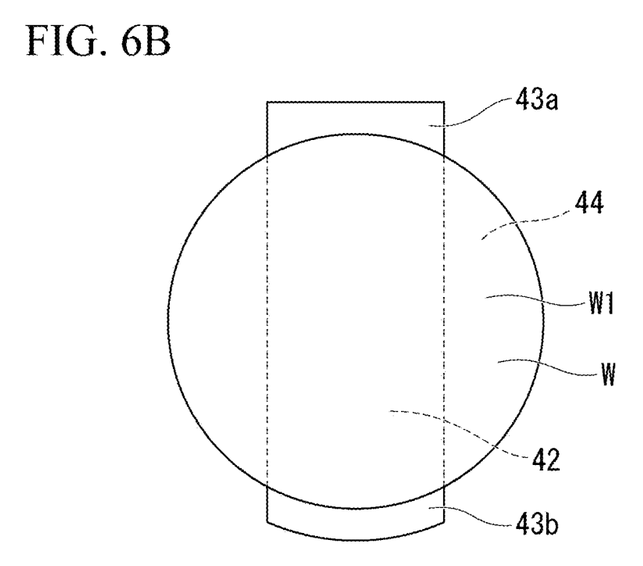
FIG. 6B is a diagram schematically illustrating a dry ice cleaning apparatus for a semiconductor wafer and a method for cleaning a semiconductor wafer according to an embodiment of the present invention, and is a planar view showing a state in which the semiconductor wafer is held in the holding section shown in FIGS. 4A and 4B.

FIG. 1 is a schematic diagram showing the overall configuration of a dry ice cleaning apparatus (hereinafter sometimes simply referred to as a cleaning apparatus) 10 for a semiconductor wafer according to the present embodiment. FIG. 2 is an enlarged side view showing a transfer robot 2 included in the cleaning device 10 shown in FIG. 1. FIG. 3 is a front view of the transfer robot 2 shown in FIG. 2. Further, FIG. 4A is an enlarged cross-sectional view showing a back plate 44 included in a holding section 4 provided in the transfer robot 2 shown in FIGS. 2 and 3. FIG. 4B is a planar view showing the holding section 4 including the back plate 44 shown in FIG. 4A. Moreover, FIG. 5A is a cross-sectional view showing a procedure for holding a semiconductor wafer W in the holding section 4 including the back plate 44 shown in FIGS. 4A and 4B, and FIG. 5B is a planar view thereof. Moreover, FIG. 6A is a cross-sectional view showing a state in which the semiconductor wafer W is held in the holding section 4 including the back plate 44 shown in FIGS. 4A and 4B, and FIG. 6B is a planar view thereof.

The cleaning device 10 of the present embodiment removes impurities (not shown in figures) attached to the cleaning surface of the semiconductor wafer W by injecting dry ice D onto the semiconductor wafer W.

As shown in FIG. 1, the cleaning apparatus 10 of the present embodiment includes a cleaning chamber 1 having an internal space 11 into which the semiconductor wafers W are sequentially carried in to be cleaned; an inject cleaning nozzle 5 that is arranged in the internal space 11 of the cleaning chamber 1 and injects the dry ice D toward the cleaning surface W1 of the semiconductor wafer W (see FIG. 5A, and the like); a transfer robot 2 which is installed in the internal space 11 of the cleaning chamber 1 and sequentially carries the semiconductor wafers W from the outside of the cleaning chamber 1 into the internal space 11.

In the cleaning device 10 of the present embodiment, the inject cleaning nozzle 5 injects the dry ice D onto the semiconductor wafer W while the transfer robot 2 holds the semiconductor wafer W carried into the internal space 11 non-horizontally.

The cleaning apparatus 10 of the present embodiment further includes a wafer carry-in pass box 6 that sequentially carries the semiconductor wafers W to be cleaned into the internal space 11 of the cleaning chamber 1 and a wafer carry-out pass box 7 that sequentially carries out the cleaned semiconductor wafers from the internal space 11 of the cleaning chamber 1.

The illustrated cleaning device 10 further includes a fan filter unit 8 in the internal space 11 of the cleaning chamber 1 that circulates a purifying gas C in a down flow from a ceiling 1C side to a floor 1D side of the cleaning chamber 1. In addition, the illustrated cleaning device 10 further includes a blower 9 that circulates the purifying gas C in the internal space 11 of the cleaning chamber 1 using the fan filter unit 8.

The cleaning chamber 1 functions as a housing in the cleaning device 10 and also cleans the semiconductor wafer W in the internal space 11.

The illustrated cleaning chamber 1 has a cubic shape and therefore has an internal space in a cubic shape, and accommodates the inject cleaning nozzle 5, transfer robot 2, fan filter unit 8, blower 9, and the like in the internal space 11.

Further, although detailed illustration is omitted in FIG. 1, the wafer carry-in pass box 6, the details of which will be described later, is attached to the side wall 1A of the cleaning chamber 1. A communicating portion 14 communicating with the wafer carry-in pass box 6 is open.

Further, in the cleaning chamber 1, a wafer carry-out pass box 7, the details of which will be described later, is attached to the side wall 1B that is disposed opposite the side wall 1A. A communication portion 15 communicating with the wafer carry-out pass box 7 is open.

Further, a purifying gas introduction pipe 12 for supplying and circulating the purifying gas C in the internal space 11 is connected to the ceiling 1C of the cleaning chamber 1.

Furthermore, a purifying gas discharge pipe 13 for the discharge of purifying gas C that has circulated in the internal space 11 and residual gas that has remained in the internal space 11 to the outside is connected to the floor 1D of the cleaning chamber 1.

The cleaning device 10 can efficiently clean the semiconductor wafer W by keeping the internal space 11 in a fresh gas atmosphere at all times.

Furthermore, in the cleaning device 10, while introducing the purifying gas C into the internal space 11 from the purifying gas introduction pipe 12, the circulated purifying gas C is discharged from the purifying gas discharge pipe 13 for a certain period of time or more. Thereby, it is possible to replace the gas atmosphere with a desired gas atmosphere such as clean dry air or high-purity nitrogen gas, for example.

Furthermore, a ceiling unit 8A including the fan filter unit 8 is provided near the ceiling 1C of the cleaning chamber 1, although details will be described later.

Also, a floor unit 8B including the fan filter unit 8 is provided near the floor 1D of the cleaning chamber 1, similar to the ceiling 1C.

As described above, the transfer robot 2 sequentially carries the semiconductor wafers W from the outside of the cleaning chamber 1 into the internal space 11. Specifically, the transfer robot 2 sequentially carries the semiconductor wafers W one by one housed in the wafer carry-in pass box 6 shown in FIG. 1 into the internal space 11, and then arranges the semiconductor wafer W to a position facing an injection port 5a of the inject cleaning nozzle 5, which will be described in detail later. The transfer robot 2 also has a function of moving the semiconductor wafer W close to the inject cleaning nozzle 5 when the semiconductor wafer W is being cleaned by the dry ice D injected from the inject cleaning nozzle 5.

Furthermore, the transfer robot 2 carries the semiconductor wafer W, which has been cleaned by the dry ice D injected from the inject cleaning nozzle 5, in the wafer carry-out pass box 7.

As shown in FIGS. 1 and 2, the transfer robot 2 includes an arm portion 3 attached to a base 20 and a holding section 4 attached to the tip of the arm portion 3. The arm portion 3 of the transfer robot 2 in the present embodiment can support the holding section 4 having a back plate 44 that holds the semiconductor wafer W non-horizontally, and also supports the holding section 4 movably in the internal space 11 of the cleaning chamber 1.

Although not shown in FIG. 1, the base 20 of the transfer robot 2 is fixed to one of the side walls of the cleaning chamber 1 by a fixing member or the like (not shown in figures).

The arm portion 3 is rotatably attached to the fixed portion 21 of the base 20 by a base shaft (not shown in figures). Further, in the illustrated example arm portion 3, three arms 31, 32, 33 are arranged in series, and any one of three support shafts 34, 35, 36 is connected between these arms 31, 32, 33. Due to the arrangement, the three arms 31, 32, 33 are rotatably connected. Thereby, the arm portion 3 can operate like a so-called magic arm that can move the holding section 4, which will be described later, in three dimensions.

In addition, in the arm portion 3, the fixing portion 21 can be rotated within a range of 360° at the upper surface of the base 20 by, for example, a motor (not shown in figures) provided inside the base 20. Furthermore, each of the arms 31, 32, and 33 is rotated by a motor (not shown in figures) provided inside the fixed portion 21 and the support shafts 34, 35, and 36.

The holding section 4 is attached to the tip of the arm portion 3 and can hold and move the semiconductor wafer W. In the embodiment shown in FIGS. 1 and 2, the holding section 4 is rotatably attached to the arm 33 of the arm portion 3 by the support shaft 36. That is, the holding section 4 is integrated with the arm portion 3 and operates together with the arm portion 3 like a magic arm.

As shown in FIG. 3, a holding arm 42 for holding the semiconductor wafer W is attached to the tip of the support base 41 of the holding section 4. By attaching the support base 41 to the arm 33 of the arm portion 3, the holding section 4 is integrated with the arm portion 3.

Further, in the holding section 4, the back plate 44 for stably holding the semiconductor wafer W is arranged on one side of the holding arm 42. The back plate 44 in the illustrated embodiment has a circular shape in planar view, and is, for example, a plate-like member having the same diameter as that of the semiconductor wafer W that is the object to be cleaned.

Further, the holding section 4 is provided with an upper claw 43a and a lower claw 43b for holding the semiconductor wafer W so as to sandwich from above and below (see also FIGS. 6A, 6B, and the like). In the embodiment shown in FIGS. 4A and 4B, the upper claw 43a is fixed to the periphery of the back plate 44, and the lower claw 43b is fixed to the lower end of the holding arm 42.

Further, the upper claw 43a and the lower claw 43b have a side surface disposed on the back plate 44 recessed in an arc shape in a planar view so that the peripheral end of the semiconductor wafer W, which is the object to be cleaned, is fitted.

When holding the semiconductor wafer W in the holding section 4, first, as shown in FIG. 4B, the holding arm 42 is extended so that the lower claw 43b is separated from the back plate 44.

Next, as shown in FIGS. 5A and 5B, the semiconductor wafer W is placed so that the back surface W2 of the semiconductor wafer W is in contact with the holding surface 44a of the back plate 44. In this state, neither the upper claw 43a nor the lower claw 43b is in contact with the semiconductor wafer W.

Next, as shown in FIGS. 6A and 6B, the holding arm 42 is retracted so that the lower claw 43b moves in a direction in which it contacts the peripheral edge of the semiconductor wafer W. As a result, the semiconductor wafer W is held between the upper claw 43a and the lower claw 43b so that the circumferential end thereof is sandwiched from above and below, and the back surface W2 is stably held by the back plate 44.

As shown in FIGS. 6A and 6B, when the semiconductor wafer W is sandwiched between the upper claw 43a and the lower claw 43b, the upper claw 43a and the lower claw 43b are in contact only with the peripheral edge of the semiconductor wafer W, and do not bide the cleaning surface W1. Accordingly, it becomes possible to clean the cleaning surface W1 evenly and uniformly.

Further, since the entire back surface W2 of the semiconductor wafer W is in close contact with the holding surface of the back plate 44, there is almost no gap between them, and the semiconductor wafer W is stably held.

The movement of the holding arm 42 is performed by, for example, a driving means such as a motor (not shown in figures) provided inside the support base 41.

The cleaning device 10 of the present embodiment includes the transfer robot 2 having the holding section 4 including the back plate 22 and the arm portion 3. Therefore, the back plate 44 stably supports the semiconductor wafer W even when the dry ice D is injected at high pressure from the inject cleaning nozzle 5, which will be described in detail later. This can prevent the semiconductor wafer W from being deformed or damaged by the high-pressure dry ice D.

The transfer robot 2 in the cleaning device 10 of the present embodiment preferably arranges the semiconductor wafer W carried into the internal space 11 at an angle of 0° to 60°, and more preferably at an angle of 0° to 30° with respect to the vertical direction. That is, it is preferable to hold the semiconductor wafer W vertically or to hold the cleaning surface W1 of the semiconductor wafer W diagonally upward at the angle above. At this time, as shown in FIG. 2, when cleaning the semiconductor wafer W, the semiconductor wafer W is held at the angle above and the injection port 5a of the inject cleaning nozzle 5 is brought close to the cleaning surface W1.

Particles, burrs, and the like attached to the cleaning surface W1 of the semiconductor wafer W are effectively dropped by the dry ice D injected from the inject cleaning nozzle 5 by holding the semiconductor wafer W vertically, or by holding the cleaning surface of the semiconductor wafer W to face diagonally upward at the angle above with the transfer robot 2 explained above. Thereby, the amount of particles remaining on the cleaning surface W1 of the semiconductor wafer W can be reduced.

The inject cleaning nozzle 5 injects the dry ice D toward the cleaning surface W1 of the semiconductor wafer W from the injection port 5a. That is, the inject cleaning nozzle 5 injects the dry ice D onto the cleaning surface W1 of the semiconductor wafer W which has been carried into the internal space 11 and held non-horizontally by the transfer robot 2.

A dry ice introduction pipe 52 for supplying the dry ice D and a purifying gas introduction pipe 53 for supplying the purifying gas C are connected to the inflow port 5b of the nozzle body 51 of the inject cleaning nozzle 5 in the illustrated embodiment. The dry ice D and the purifying gas C are mixed within the nozzle body 51 and injected from the injection port 5a.

That is, the inject cleaning nozzle 5 causes the purifying gas C such as high-purity nitrogen gas or clean dry air to collide with the cleaning surface W1 of the semiconductor wafer W in addition to the dry ice D, thereby removing impurities attached to the cleaning surface W1.

The inject cleaning nozzle 5 preferably injects the dry ice D from the injection port 5a at an angle of 0° to 80°, and more preferably at an angle of 0° to 30°, with respect to the direction perpendicular to the cleaning surface W1 of the semiconductor wafer W. That is, it is preferable to inject the dry ice D from the injection port 5a from a direction perpendicular to the cleaning surface W1 of the semiconductor wafer W, or downwardly inject the dry ice from the angle above with respect to the direction perpendicular to the cleaning surface W1. By setting the injecting direction of the dry ice D from the inject cleaning nozzle 5 to the cleaning surface W1 of the semiconductor wafer W at an angle within the range above, particles, burrs, and the like attached to the cleaning surface W1 of the semiconductor wafer W are fallen more effectively by the dry ice D injected from the inject cleaning nozzle 5. Thereby, the amount of particles and the like remaining on the cleaning surface W1 of the semiconductor wafer W can be more effectively reduced.

In the present embodiment, since the inject cleaning nozzle 5 is fixed in the internal space 11 of the cleaning device 1, the dry ice introduction pipe 52 and the purifying gas introduction pipe 53 are also fixed in the internal space 11. Therefore, during cleaning, the transfer robot 2 moves the semiconductor wafer W relative to the fixed inject cleaning nozzle 5. By fixing the dry ice introduction pipe 52 and the purifying gas introduction pipe 53 in this way, it is possible to prevent the generation of particles due to movement or vibration of piping or joints.

Furthermore, in the present embodiment, the inject cleaning nozzle 5 is fixed in the internal space 11 of the cleaning device 1, and the semiconductor wafer W is moved relative to the fixed inject cleaning nozzle 5 by the transfer robot 2. The present invention is not limited to the present embodiment. For example, when the amount of particles generated from piping and fittings is sufficiently reduced, the semiconductor wafer W is fixed in the internal space 11 of the cleaning device 1, and the inject cleaning nozzle 5 is moved relative to the fixed semiconductor wafer W by a robot.

The wafer carry-in pass box 6 allows the semiconductor wafer W to be carried into the internal space 11 of the cleaning chamber 1 while the internal space 11 is isolated from the atmosphere. The wafer carry-in pass box 6 is provided so as to be able to communicate with the internal space 11 via a communication portion 14 opened at the side wall 1A of the cleaning chamber 1. The semiconductor wafers W arranged in a line in a carry-in box 64 are carried into the wafer carry-in pass box 6 by a device such as a robot or by a manual method.

The wafer carry-in pass box 6 shown in FIG. 1 accommodates semiconductor wafers W arranged in a line in a carry-in box 64 inside a box body 61. An introduction pipe 65 is connected to the box body 61 for supplying the purifying gas C such as clean dry air or high-purity nitrogen gas to the inside of the box body 61. Furthermore, a discharge pipe 66 is connected to the box body 61 for discharging the purifying gas C that has circulated inside the box body 61 to the outside.

As a result, as in the case of the cleaning chamber 1, while introducing the purifying gas C into the box body 61 of the wafer carry-in pass box 6 from the introduction pipe 65, the circulated purifying gas C is discharged from the discharge pipe 66 for a certain period of time, and the gas atmosphere inside the box body 61 of the wafer carry-in pass box 6 can be replaced with, for example, a desired gas atmosphere such as clean dry air or high-purity nitrogen gas.

Further, the wafer carry-in pass box 6 is provided with a carry-in door 62 for carrying the semiconductor wafer W into the box body 61 from the outside of the cleaning device 10. Further, the wafer carry-in pass box 6 is provided with a carry-in gate valve 63 that opens and closes when carrying the semiconductor wafer W into the internal space 11 of the cleaning chamber 1.

The carry-in door 62 and the carry-in gate valve 63 are normally closed when cleaning the semiconductor wafer W, thereby shutting off the internal space 11 of the cleaning chamber 1 from the atmosphere. On the other hand, when carrying the semiconductor wafer W housed in the carry-in box 64 into the box body 61, the carry-in door 62 is opened.

When the semiconductor wafer W is carried into the internal space 11 of the cleaning chamber 1, the carry-in gate valve 63 is opened.

The carry-in box 64 has a size and shape that allows, for example, about 25 semiconductor wafers W to be arranged vertically.

The wafer carry out pass box 7 allows the cleaned semiconductor wafer W to be carried out from the internal space 11 of the cleaning chamber 1 while the internal space 11 is isolated from the atmosphere. The wafer carry-out pass box 7 is provided so as to be able to communicate with the internal space 11 via a communication portion 15 opened at the side wall 1B of the cleaning chamber 1. Further, from the wafer carry-out pass box 7, the cleaned semiconductor wafers W arranged in a line in a carry-out box 74 are carried out by a device such as a robot or by a manual method.

The wafer carry-out pass box 7 shown in FIG. 1 accommodates the cleaned semiconductor wafers W in a box body 71 while being arranged in a line in the carry-out box 74. Similar to the box body 61 of the wafer carry-in pass box 6, the box body 71 is connected with an introduction pipe 75 for supplying the purifying gas C such as clean dry air or high-purity nitrogen gas to the inside of the box body 71. Further, a discharge pipe 76 is connected to the box body 71 for discharging the purifying gas C that has circulated inside the box body 71 to the outside.

As a result, similar to the cleaning chamber 1 and the wafer carry-in pass box 6, when while introducing the purifying gas C into the box body 71 from the introduction pipe 75, the circulated purifying gas C is discharged from the discharge pipe 76 for a certain period of time or more, and the gas atmosphere inside the box body 71 of the wafer carry-out pass box 7 can be replaced with, for example, a desired gas atmosphere such as clean dry air or high-purity nitrogen gas.

Further, the wafer carry-out pass box 7 is provided with a carry-out gate valve 73 that opens and closes when carrying out the cleaned semiconductor wafer W from the internal space 11 of the cleaning chamber 1.

Further, the wafer carry-out pass box 7 is provided with a carry-out door 72 for carrying out the cleaned semiconductor wafer W from inside the box body 61 to the outside of the cleaning apparatus 10.

Similar to the carry-in door 62 and carry-in gate valve 63 provided in the wafer carry-in pass box 6, the carry-out door 72 and carry out gate valve 73 are normally maintained closed when cleaning the semiconductor wafer W, and the internal space 11 of the cleaning chamber 1 is isolated from the atmosphere. On the other hand, when carrying out the cleaned semiconductor wafers W from the internal space 11 of the cleaning chamber 1, the carrying out gate valve 73 is opened and the cleaned semiconductor wafer W is accommodated in the carrying out box 74. Moreover, when carrying out the cleaned semiconductor wafers W housed in the carrying-out box 74 from the box body 71, the carrying-out door 72 is opened.

Similar to the carrying-in box 64, the carry-out box 67 has a size and shape that allows, for example, about 25 semiconductor wafers W to be arranged vertically.

The cleaning device 10 of the present embodiment includes the wafer carry-in pass box 6 and the wafer carry-out pass box 7. The transfer robot 2 introduces the semiconductor wafers W one by one into the internal space 11 of the cleaning chamber 1 from the carry-in box 64 when the carry-in gate valve 63 is opened. The semiconductor wafers W of which the cleaning surfaces W1 have been cleaned by the dry ice D injected from the inject cleaning nozzle 5 are arranged in a carry-out box 74 by the transfer robot 2 when the carry-out gate valve 73 is opened. The cleaned semiconductor wafers W housed in the carry-out box 74 are carried out from the wafer carry-out pass box 7 by a device such as a robot or by a manual method. For example, when the carry-in box 64 in which 25 semiconductor wafers are arranged in a line is set in the wafer carry-in pass box 6, and an empty carry-out box 74 with a capacity for 25 semiconductor wafers is set in the wafer carry-out pass box 7, it is possible to continuously clean a total of 25 semiconductor wafers.

As described above, the fan filter unit 8 circulates the purifying gas C in the internal space 11 of the cleaning chamber 1 in a downflow direction from the ceiling 1C side toward the floor section 1D side. The fan filter unit 8 shown in FIG. 1 includes a ceiling unit 8A disposed on the ceiling 1C side and a floor unit 8B disposed on the floor 1D side.

The fan filter unit 8 is not particularly limited, but examples of the fan filter unit 8 include, for example, a HEPA filter (High-Efficiency Particulate Air Filter), and a ULPA filter (Ultra-Low Penetration Filter) as defined in JIS Z8122:2000 without any restrictions.

In the illustrated embodiment, the ceiling unit 8A is attached to an upper partition 16 that is spaced apart from the ceiling 1C in the vertical direction (vertical direction in FIG. 1) of the internal space 11 of the cleaning chamber 1.

Additionally, the floor unit 8B is attached to a lower partition 17 provided apart from the floor 1D.

The ceiling unit 8A blows out the purifying gas C introduced from the purifying gas introduction pipe 12 into the space between the ceiling 1C in the internal space 11, the upper partition 16, and the ceiling unit 8A downward, thereby the purifying gas C is circulated in a down flow from the ceiling 1C side toward the floor 1D side.

Furthermore, the floor unit 8B sucks the purifying gas C that has blown out from the ceiling unit 8A and circulated in a down flow. Thereby, the purifying gas C is introduced into the space between the floor 1D, the lower partition 17, and the floor unit 8B in the internal space 11.

In the cleaning device 10 of the present embodiment, by the operation of the blower 9 described above, the circulated purifying gas C is introduced in a downflow manner into the space between the floor 1D, the lower partition 17, and the floor unit 8B in the internal space 11, and is introduced into the circulation inlet pipe 91. The purifying gas C introduced into the circulation inlet pipe 91 is returned to the space between the ceiling 1C, the upper partition 16, and the ceiling unit 8A in the internal space 11 through the circulation outlet pipe 92, and is repeatedly circulated.

In the present embodiment, the cleaning apparatus 10 includes the fan filter unit 8, and thereby the purifying gas C circulates in a down flow in the internal space 11 of the cleaning chamber 1. For this reason, particles, burrs, and the like attached to the cleaning surface W1 of the semiconductor wafer W are peeled off by the dry ice D injected from the inject cleaning nozzle 5, then circulated along the flow direction of the purifying gas C. and reliably collected by the filter unit 8. Thereby, clean purifying gas can be circulated in the cleaning chamber 1, so that the cleaning effect on the semiconductor wafer W can be further enhanced.

In the cleaning apparatus 10 of the present embodiment, the purifying gas C supplied to the internal space 11 of the cleaning chamber 1, the box body 61 of the wafer carry-in pass box 6, and the box body 71 of the wafer carry-out pass box 7 and circulated as necessary is not particularly limited. However, as the purifying gas C, it is preferable to use the high-purity nitrogen gas or clean dry air.

In the present embodiment, by using high-purity nitrogen gas or clean dry air as the purifying gas C supplied to the internal space 11 of the cleaning chamber 1, that is, as the purifying gas C is circulated in a down flow by the fan filter unit 8, when dry ice D is injected onto the semiconductor wafer W, it is possible to suppress the formation of ice derived from the atmospheric gas on the cleaning surface W1 due to the dry ice D. Further, it is possible to prevent the inject cleaning nozzle 5 from condensing due to the dry ice D and being blocked by ice. Therefore, the cleaning effect on the semiconductor wafer W is further enhanced, and a large amount of semiconductor wafers W can be continuously cleaned.

Further, by using high purity nitrogen gas or clean dry air as the purifying gas C supplied to the box body 61 of the wafer carry-in pass box 6, it is possible to maintain the semiconductor wafer W in a clean state before cleaning.

Furthermore, by using high-purity nitrogen gas or clean dry air as the purifying gas C supplied to the box body 71 of the wafer carry-out pass box 7, it is possible to maintain the cleaned semiconductor wafer W temporarily accommodated in the carry-out box 74 in a clean state.

Therefore, the effect of reducing the amount of particles remaining on the surface of the semiconductor wafer can be more significantly achieved.

Note that the clean dry air used as purifying gas C in the cleaning device 10 of the present embodiment is air that has been passed through a mist cleaner or dryer to reduce impurities and moisture, such as air of which the dew point is −60° C. or lower.

Furthermore, the high-purity nitrogen gas used as the purifying gas C in the present embodiment is nitrogen in which impurities and moisture are sufficiently reduced, for example, nitrogen gas with a purity of 99.99% or higher.

According to the cleaning device 10 of the present embodiment, the inject cleaning nozzle 5 injects the dry ice D onto the cleaning surface W1 of the semiconductor wafer W while the transfer robot 2 holds the semiconductor wafer W non-horizontally. Thereby, particles, burrs, and the like attached to the cleaning surface W1 of the semiconductor wafer W can be effectively removed. Accordingly, it possible to reduce the amount of particles and the like remaining on the cleaning surface W1 of the semiconductor wafer W, and to continuously and effectively clean a large amount of semiconductor wafers W.

<Method for Cleaning Semiconductor Wafer>

Below, a method for cleaning a semiconductor wafer according to the present embodiment will be explained.

In addition, in the following description, the explanation will be made with reference to the same drawings (FIGS. 1 to 6A, FIG. 68) as the dry ice cleaning apparatus 10 for semiconductor wafers described above, and detailed description regarding the cleaning apparatus 10 may be omitted.

The method for cleaning a semiconductor wafer (hereinafter sometimes simply referred to "cleaning method") of the present embodiment is a method in which impurities attached to the cleaning surface W1 of the semiconductor wafer W are removed by using the cleaning device 10 above, and the dry ice D is injected onto the semiconductor wafer W. That is, in the cleaning method of the present embodiment, the dry ice D is injected onto the semiconductor wafer W carried into the internal space 11 of the cleaning chamber 1 while the semiconductor wafer W is held non-horizontally.

First, in the cleaning apparatus 10 shown in FIG. 1, the carry-in door 62 of the wafer carry-in pass box 6 is opened, and the carry-in box 64 containing a total of 25 semiconductor wafers, which are objects to be cleaned, in a vertical position is set in the box body 61.

Next, clean dry air is supplied as the purifying gas C into the wafer carry-in pass box 6 through the introduction pipe 65 while being discharged from the discharge pipe 66, and this state is maintained for, for example, 10 minutes. As a result, the gas atmosphere in the wafer carry-in pass box 6 is completely replaced with a clean dry air atmosphere.

At the same time, the carry-out box 74 which can accommodate a total of 25 semiconductor wafers in a vertical position is set in the box body 71 of the wafer carry-out pass box 7, and clean dry air is supplied as the purifying gas C into the wafer carry-out pass box 7 through the inlet pipe 75 while being discharged from the discharge pipe 76, and this state is maintained for, for example, 10 minutes, similar to the wafer carry-in pass box 6. As a result, the gas atmosphere in the wafer carry-out pass box 7 is completely replaced with a clean dry air atmosphere.

The internal space 11 of the cleaning chamber 1 is supplied with clean dry air as the purifying gas C through the purifying gas introduction pipe 12 in advance, and discharge of the clean dry air is maintained constantly from the purifying gas discharge pipe 13.

In addition, by starting the fan filter unit 8 and the blower 9, the clean dry air is circulated in the internal space 11 in a down flow, and the clean dry air (purifying gas C) is continuously purified.

Next, the carry-in gate valve 63 of the wafer carry-in pass box 6 is opened, and the arm portion 3 and holding section 4 of the transfer robot 2 installed in the cleaning chamber 1 are moved into the box body 61 of the wafer carry-in pass box 6.

Next, as described above, a first semiconductor wafer W in the carry-in box 64 is captured and moved into the cleaning chamber 1 by the operation of the holding section 4 shown in FIGS. 4A, 4B to 6B.

At this time, as shown in FIG. 2, the arm portion 3 and the holding section 4 are operated so that the semiconductor wafer W is placed in a position close to the injection port 5a of the inject cleaning nozzle 5. Further, at this time, as shown in FIGS. 2 and 3, the semiconductor wafer W is set at 0° with respect to the vertical direction, that is, in a perpendicular state.

Next, the dry ice D and the purifying gas C such as high-purity nitrogen are injected from the inject cleaning nozzle 5 toward the cleaning surface W1 of the semiconductor wafer W.

At this time, by moving the holding section 4 vertically and horizontally in planar view of the back plate 44 using the arm portion 3 of the transfer robot 2, impurities attached to the cleaning surface W1 of the semiconductor wafer W are uniformly and evenly removed.

Then, after impurities are removed from the entire cleaning surface W1 of the semiconductor wafer W, the injection of the dry ice D from the inject cleaning nozzle 5 is stopped.

Next, the discharge gate valve 73 provided in the wafer carry-out pass box 7 is opened, and the arm portion 3 and the holding section 4 of the transfer robot 2 are moved into the box body 71 of the wafer carry-out pass box 7.

Then, the cleaned semiconductor wafer W is accommodated in the carry-out box 74 in a vertical position.

Then, the transfer robot 2 returns to the initial position in the internal space 11 of the cleaning chamber 1.

Then, the carry-out gate valve 73 of the wafer carry-out pass box 7 is closed.

The procedure above is repeated for a total of 25 semiconductor wafers W housed in the carry-in box 64, and when all the semiconductor wafers W are cleaned, the carry-out door 72 provided in the wafer carry-out pass box 7 is opened and the cleaning process is completed. After taking out the carry-out box 74 containing a total of 25 processed semiconductor wafers, the carry-out door 72 is closed.

In the cleaning method of the present embodiment, the dry ice D is injected onto a semiconductor wafer W using the cleaning apparatus 10 described above, and the cleaning surface W1 of the semiconductor wafer W is cleaned. Therefore, similar to the cleaning device 10 described above, particles, burrs, and the like attached to the cleaning surface W1 of the semiconductor wafer W can be effectively removed. As a result, the amount of particles remaining on the cleaning surface W1 of the semiconductor wafer W can be reduced, and the cleaning efficiency can be prevented from decreasing due to the formation of ice by the dry ice D, and a large amount of semiconductor wafers W can be continuously and effectively cleaned.

Note that the dry ice D used in the present embodiment is not particularly limited, but, for example, granular ice having a particle size of about 5 to 100 μm can be used.

Further, the amount of the dry ice D to be used is not particularly limited, but for example, in the cleaning process of one semiconductor wafer W, 0.1 to 1 kg of the dry ice D may be injected for 1 to 20 minutes.

Further, the injection pressure of the purifying gas C injected from the inject cleaning nozzle 5 together with the dry ice D is not particularly limited, but may be, for example, about 0.3 to 1.0 MPa.

Effect

As explained above, according to the dry ice cleaning apparatus 10 for a semiconductor wafer of the present embodiment, while holding the semiconductor wafer W carried into the internal space 11 non-horizontally with the transfer robot 2, the inject cleaning nozzle 5 injects the dry ice D onto the semiconductor wafer W. Thereby, particles, burrs, and the like attached to the cleaning surface W1 of the semiconductor wafer W can be effectively removed. Therefore, the amount of particles remaining on the cleaning surface W1 of the semiconductor wafer W can be reduced, and a large amount of semiconductor wafers W can be continuously and effectively cleaned.

In addition, the method for cleaning a semiconductor wafer of the present embodiment is a method in which the dry ice D is injected onto the semiconductor wafer W using the dry ice cleaning apparatus 10 for a semiconductor wafer described above, and the cleaning surface W1 of the semiconductor wafer W is cleaned. Similar to the cleaning device 10 described above, particles, burrs, and the like attached to the cleaning surface W1 of the semiconductor wafer W can be effectively removed. Therefore, the amount of particles remaining on the cleaning surface W1 of the semiconductor wafer W can be reduced, and a large amount of semiconductor wafers W can be continuously and effectively cleaned.

EXAMPLES

Hereinafter, the dry ice cleaning apparatus for a semiconductor wafer and the method for cleaning a semiconductor wafer according to the present invention will be explained in more detail with reference to Examples, but the present invention is not limited thereto.

Test Methods and Conditions in Experimental Examples 1 to 4

In Experimental Examples 1 to 4 described below, in order to demonstrate the effects of the dry ice cleaning apparatus for a semiconductor wafer and the method for cleaning a semiconductor wafer according to the present invention, using the cleaning apparatus 10 according to the present invention as shown in FIGS. 1 to 6A and 6B, the surface of a semiconductor wafer was cleaned with dry ice under the conditions and procedures shown below to remove impurities (particles) on the cleaning surface, and the amount of residue was examined.

Experiment Example 1: Cleaning Effect Depending on Angle of Semiconductor Wafer

In Experimental Example 1, a 6-inch silicon single crystal semiconductor substrate (semiconductor wafer W) cut out from an ingot was held in the holding section 4 of the transfer robot 2 provided in the cleaning apparatus 10. At this time, the semiconductor wafer W was held at an angle of 0° to 30° with respect to the vertical direction. More specifically, the semiconductor wafer W was held vertically or non-horizontally so that the cleaning surface W1 of the semiconductor wafer W faced diagonally upward. Then, dry ice D was injected from the inject cleaning nozzle 5 to the cleaning surface W1 of the semiconductor wafer W in this state, and after the cleaning process was performed, the number of particles remaining on the cleaning surface W1 was measured.

At this time, the dry ice D having an average particle diameter (D50) of 50 μm was used.

In addition, the experiment was conducted with 0.3 kg of the dry ice D being used for cleaning one semiconductor wafer W, and the cleaning time for injecting this amount of the dry ice D was 5 minutes.

In addition, high-purity nitrogen gas was used as the purifying gas C that was injected from the inject cleaning nozzle 5 to the cleaning surface W1 of the semiconductor wafer W together with the dry ice D, and the injection pressure was set to about 0.5 MPa.

In addition, as a comparative example for the conditions above, the semiconductor wafer W was set perpendicular to the vertical direction (90 degrees), that is, in a horizontal state, the dry ice D was injected onto the cleaning surface W1 of the semiconductor wafer W in the same manner as above, and the number of particles remaining on the cleaning surface W1 was measured. The average particle diameter (D50), usage amount of the dry ice D and the purifying gas, and cleaning time (injection time) of the dry ice D used were also the same as those in Experiment example 1 above.

As a result of the experiments above, when the semiconductor wafer W was held so as to be tilted at an angle of 0° to 30° with respect to the vertical direction (the semiconductor wafer W was held vertically or non-horizontally so that the cleaning surface W1 of the semiconductor wafer W was facing diagonally upward), and the dry ice D was injected onto the cleaning surface W1, the number of particles remaining on the cleaning surface W1 was suppressed to 1/100 or less at most compared to the case in which the semiconductor wafer W was set horizontally.

From this result, it was confirmed that by holding the semiconductor wafer W vertically or with the cleaning surface W1 facing diagonally upward, particles and the like are less likely to remain on the cleaning surface W1.

Experiment Example 2: Cleaning Effect of Semiconductor Wafer Depending on Presence or Absence of Back Plate In Experimental Example 2, in order to investigate the effect of the back plate 44, cleaning experiments were conducted on a semiconductor wafer W both with and without the back plate 44 shown in FIGS. 6A and 6B.

In Experimental Example 2, in order to further improve cleaning efficiency, the injection pressure of the dry ice D and the purifying gas C injected from the inject cleaning nozzle 5 was set to a relatively high pressure of 0.8 MPa. The experiments were conducted in the same manner as in Experimental Example 1, except for the presence or absence of the back plate 44 and the injection pressure of the dry ice D and the purifying gas C.

When the back plate 44 was not provided, the semiconductor wafer W was held only by the holding arm 42, and only a part of the back surface W2 of the semiconductor wafer W was supported. When the dry ice D and the purifying gas C were injected at high pressure, excessive force was applied to the cleaning surface W1, and the semiconductor wafer W was deformed and damaged.

On the other hand, when the back plate 44 was provided, the entire back surface W2 of the semiconductor wafer W was supported by the back plate 44. Therefore, even when high pressure was applied to the cleaning surface W1 by the dry ice D and the purifying gas C, the semiconductor wafer W was not deformed and no damage occurred.

Experiment Example 3: Cleaning Effect Due to Downflow of Purifying Gas

In Experimental Example 3, the effect of circulating the purifying gas C in a down flow during cleaning of a semiconductor wafer W was investigated.

Specifically, using the fan filter unit 8 shown in FIG. 1, the number of particles remaining on the cleaning surface W1 of the semiconductor wafer W was measured in both a case in which the dry ice D was injected onto the cleaning surface W1 of the semiconductor wafer W to be cleaned while circulating the purifying gas C in a down flow in the internal space 11 of the cleaning chamber 1, and a case in which the fan filter unit 8 was not used in the internal space 11 of the cleaning chamber 1.

In Experimental Example 3, the experiments were carried out in the same manner as in Experimental Example 1, except for the presence or absence of the fan filter unit 8 described above.

As a result of the experiments above, when cleaning the cleaning surface W1 of the semiconductor wafer W using the fan filter unit 8 while circulating the purifying gas C in a down flow in the internal space 11 of the cleaning chamber 1, the number of particles remaining on the cleaning surface W1 of the semiconductor wafer W was suppressed to 1/100 or less at most compared to the case in which no circulation was performed.

Experiment Example 4: Cleaning Effect by Supplying Purifying Gas into Cleaning Chamber In Experimental Example 4, the effect of supplying the purifying gas C, that is, clean dry air and high-purity nitrogen gas, into the internal space 11 of the cleaning chamber 1 was confirmed.

In Experimental Example 4, the experiments were conducted in the same manner as in Experimental Example 1 above, except that the type of purifying gas C supplied to the internal space 11 of the cleaning chamber 1 was changed.

As a result of the experiments above, when the cleaning surface W1 of the semiconductor wafer W was cleaned while supplying clean dry air or high-purity nitrogen gas as the purifying gas C into the internal space 11 of the cleaning chamber 1, the dirt on the cleaning surface W1 of the semiconductor wafer W could be almost completely removed.

On the other hand, when normal air was supplied into the internal space 11 of the cleaning chamber 1, the dry ice D formed ice derived from the moisture in the air, and the impurities on the cleaning surface W1 could not be completely removed. Alternatively, there were cases in which dew condensation formed on the injection port 5a of the inject cleaning nozzle 5, making it impossible to perform the cleaning process continuously.

From the results explained above, it was confirmed that the dry ice cleaning apparatus for a semiconductor wafer and the method for cleaning a semiconductor wafer using the same according to the present invention could reduce the amount of particles and the like on the surface of the semiconductor wafers, and could also prevent a decrease in the cleaning efficiency caused by ice formation.

INDUSTRIAL APPLICABILITY

The dry ice cleaning apparatus for a semiconductor wafer according to the present invention can reduce the amount of particles, and the like on the surface of the semiconductor wafer, can prevent a decrease in the cleaning efficiency due to ice formation, and can perform continuous and effective cleaning processing of a large amount of semiconductor wafers. Therefore, the dry ice cleaning apparatus for a semiconductor wafer according to the present invention is very suitable for use in removing particles, burrs, and the like from a semiconductor wafer, for example, in the production process of semiconductor devices.

EXPLANATION OF REFERENCE NUMERALS 1 dry ice cleaning apparatus for a semiconductor wafer
1A, 1B side wall
1C ceiling
1D floor
11 internal space
12 purifying gas introduction pipe
13 purifying gas discharge pipe
14, 15 communication portion
16 upper partition
17 lower partition
2 transfer robot
20 base
21 fixed portion
3 arm portion
31, 32, 33 arm
34, 35, 36 support shaft
4 holding section
41 support base
42 holding arm
43a upper claw
43b lower claw
44 back plate
44a holding surface
5 inject cleaning nozzle
51 nozzle body
5a injection port
5b inflow port
52 dry ice introduction pipe
53 purifying gas introduction pipe
6 wafer carry-in pass box
61 box body
62 carry-in door
63 carry-in gate valve
64 carry-in box
65 introduction pipe
66 discharge pipe
7 wafer carry-out pass box
71 box body
72 carry-out door
73 carry-out gate valve
74 carry-out box
75 introduction pipe
76 discharge pipe
8 fan filter unit
8A ceiling unit
8B floor unit
9 blower
91 circulation inlet pipe
92 circulation outlet pipe
W semiconductor wafer
W1 cleaning surface
W2 back surface
C purifying gas
D dry ice

The invention claimed is:

1. A dry ice cleaning apparatus for semiconductor wafers that removes impurities attached to a cleaning surface of the semiconductor wafers by injecting dry ice onto the semiconductor wafers,
wherein the dry ice cleaning apparatus comprises:
a cleaning chamber having an internal space configured to sequentially receive the semiconductor wafers for cleaning;
an inject cleaning nozzle that is disposed in the internal space of the cleaning chamber, the inject cleaning nozzle being configured to inject a purifying gas together with the dry ice toward the cleaning surface of at least one of the semiconductor wafers at an injection pressure of the purifying gas in a range from 0.3 MPa to 1.0 MPa; and
a transfer robot that is disposed in the internal space of the cleaning chamber, has a holding section including a back plate configured to hold the at least one semiconductor wafer, and the transfer robot is configured to sequentially carry the semiconductor wafers from the outside of the cleaning chamber into the internal space;
wherein the inject cleaning nozzle is configured to inject the dry ice and the purifying gas onto the at least one semiconductor wafer with the transfer robot holding the at least one semiconductor wafer non-horizontally while bringing an entire back surface of the at least one semiconductor wafer carried into the internal space into close contact with a holding surface of the back plate; and
wherein the holding section is provided with an upper claw and a lower claw arranged to sandwich the at least one semiconductor wafer, and the upper claw and the lower claw are configured to hold a peripheral end of the at least one semiconductor wafer by sandwiching it in an arc shape.

2. The dry ice cleaning apparatus for semiconductor wafers according to claim 1,
wherein the transfer robot further comprises an arm portion configured to support the holding section non-horizontally and movably support the holding section in the internal space of the cleaning chamber.

3. The dry ice cleaning apparatus for semiconductor wafers according to claim 1,
wherein the transfer robot is configured to hold the at least one semiconductor wafer carried into the internal space at an angle in a range from 0° to 30° or less with respect to the vertical direction so as to hold the at least one semiconductor wafer vertically, or face the cleaning surface of the at least one semiconductor wafer diagonally upward.

4. The dry ice cleaning apparatus for semiconductor wafers according to claim 1,
wherein the inject cleaning nozzle is configured to inject the dry ice and the purifying gas at an angle in a range from 0° to 80° with respect to a direction perpendicular onto the cleaning surface of the at least one semiconductor wafer so as to inject the dry ice and the purifying gas perpendicularly to the cleaning surface of the at least one semiconductor wafer, or inject the dry ice and the purifying gas in a direction that is more downward than perpendicular to the cleaning surface of the at least one semiconductor wafer.

5. The dry ice cleaning apparatus for semiconductor wafers according to claim 1,
wherein the dry ice cleaning apparatus further comprises a fan filter unit that configured to circulate the purifying gas in the internal space of the cleaning chamber by causing the purifying gas to flow down from the ceiling side to the floor side of the cleaning chamber.

6. The dry ice cleaning apparatus for semiconductor wafers according to claim 5,
wherein the purifying gas which is circulated in flow down is high purity nitrogen gas or clean dry air.

7. A method for cleaning semiconductor wafers to remove impurities attached to the cleaning surface of at least one of the semiconductor wafers by using the dry ice cleaning apparatus for the semiconductor wafers according to claim 1, and injecting the dry ice and the purifying gas onto the semiconductor wafer from the inject cleaning nozzle,
wherein while the at least one semiconductor wafer carried into the internal space of the cleaning chamber is held non-horizontally, the dry ice and the purifying gas are injected from the inject cleaning nozzle onto the semiconductor wafer.

* * * * *